United States Patent
Khayat et al.

(10) Patent No.: US 9,268,629 B2
(45) Date of Patent: *Feb. 23, 2016

(54) DUAL MAPPING BETWEEN PROGRAM STATES AND DATA PATTERNS

(71) Applicant: Micron Technology, Inc., Boise, ID (US)

(72) Inventors: Patrick R. Khayat, San Diego, CA (US); Sivagnanam Parthasarathy, Carlsbad, CA (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/747,501

(22) Filed: Jun. 23, 2015

(65) Prior Publication Data

US 2015/0286522 A1 Oct. 8, 2015

Related U.S. Application Data

(63) Continuation of application No. 13/780,499, filed on Feb. 28, 2013, now Pat. No. 9,081,674.

(51) Int. Cl.
*G11C 29/00* (2006.01)
*G06F 11/07* (2006.01)
*G06F 3/06* (2006.01)

(52) U.S. Cl.
CPC .......... *G06F 11/0793* (2013.01); *G06F 3/0619* (2013.01); *G06F 3/0673* (2013.01); *G06F 11/0727* (2013.01); *G06F 11/0751* (2013.01)

(58) Field of Classification Search
CPC ............ G06F 11/0793; G06F 11/0727; G06F 11/0751; G06F 11/0619; G06F 11/0673
See application file for complete search history.

(56) References Cited

U.S. PATENT DOCUMENTS

| | | | |
|---|---|---|---|
| 6,469,931 | B1 | 10/2002 | Ban et al. |
| 6,587,372 | B2 | 7/2003 | Blodgett |
| 6,959,412 | B2 | 10/2005 | Silvus et al. |
| 7,030,789 | B1 | 4/2006 | Cideciyan et al. |
| 7,071,849 | B2 | 7/2006 | Zhang |

(Continued)

OTHER PUBLICATIONS

Yang, et al., "Product Code Schemes for Error Correction in MLC NAND Flash Memories," Research Paper, Dec. 2012, vol. 20, Issue 12, pp. 2302-2314.

(Continued)

*Primary Examiner* — Sam Rizk
(74) *Attorney, Agent, or Firm* — Brooks, Cameron & Huebsch, PLLC

(57) ABSTRACT

The present disclosure includes methods and apparatuses for dual mapping between program states and data patterns. One apparatus includes a memory and a controller configured to control a dual mapping method comprising: performing a base conversion on a received data pattern and mapping a resulting base converted data pattern to one of a first number of program state combinations corresponding to a first group of memory cells; and determining a number of error data units corresponding to the base converted data pattern and mapping the number of error data units to one of a number of second program state combinations corresponding to a second group of memory cells. The number of error data units are mapped to the one of the second number of program state combinations corresponding to the second group of memory cells without being base converted.

20 Claims, 7 Drawing Sheets

(56) References Cited

U.S. PATENT DOCUMENTS

| | | |
|---|---|---|
| 7,848,142 B2 | 12/2010 | Radke |
| 8,031,529 B2 | 10/2011 | Sarin |
| 8,085,590 B2 | 12/2011 | Litsyn et al. |
| 2008/0158948 A1 | 7/2008 | Sharon et al. |
| 2009/0109747 A1 | 4/2009 | Radke |
| 2010/0157641 A1 | 6/2010 | Shalvi et al. |
| 2010/0306619 A1 | 12/2010 | Yang |
| 2011/0058424 A1 | 3/2011 | Goda et al. |
| 2011/0276749 A1 | 11/2011 | Litsyn et al. |
| 2012/0307559 A1 | 12/2012 | Shen et al. |

OTHER PUBLICATIONS

U.S. Appl. No. 13/444,314, entitled "Mapping Between Program States and Data Patterns," filed Apr. 11, 2012, (44 pgs.).

| | | 439-1 | 439-2 | 439-3 | 439-4 |
|---|---|---|---|---|---|
| | LEVELS / CELL | 7 | 11 | 13 | 14 |
| | MAX BITS / CELL | 2.807355 | 3.459432 | 3.70044 | 3.807355 |
| USER DATA | STORED BITS / CELL | 2.8 | 3.4 | 3.6 | 3.8 |
| | NUMBER OF CELLS | 5 | 5 | 5 | 5 |
| | BITS / GROUP (NATIVE) | 14 | 17 | 18 | 19 |
| | BITS / GROUP (BASE CONVERTED) | 15 | 20 | 20 | 20 |
| | EXPANSION FACTOR | 7% | 18% | 11% | 5% |
| PARITY | STORED BITS / CELL | 2.5 | 3.25 | 3.5 | 3.5 |

*Fig. 4*

| | | BITS | CELLS |
|---|---|---|---|
| USER | | 16384 | 5852 |
| EXPANDED USER | | 17555 | 5852 |
| ECC PARITY | 0.10 | 1951 | 781 |
| CODEWORD | | 19506 | 6633 |
| ECC OVERHEAD | | 0.160053 | 0.117745 |

*Fig. 5*

650 ⟶ 1.5 BITS/CELL

| CELL1 STATES /-652 | | | |
|---|---|---|---|
| L2 | 6 | 7 | X |
| L1 | 2 | 3 | 5 |
| L0 | 0 | 1 | 4 |
| | L0 | L1 | L2 |

CELL0 STATES -651

BIT[2] = 0
(BINARY VALUE OF DATA PATTERN < 4)

| BIT[2:0] | | | PGM STATES OF CELLS [1:0] | |
|---|---|---|---|---|
| [2] | [1] | [0] | CELL 1 | CELL 0 |
| 0 | 0 | 0 | L0 | L0 |
| 0 | 0 | 1 | L0 | L1 |
| 0 | 1 | 0 | L1 | L0 |
| 0 | 1 | 1 | L1 | L1 |

BIT[2] = 1
(BINARY VALUE OF DATA PATTERN ≥ 4)

| BIT[2:0] | | | PGM STATES OF CELLS [1:0] | |
|---|---|---|---|---|
| [2] | [1] | [0] | CELL 1 | CELL 0 |
| 1 | 0 | 0 | L0 | L2 |
| 1 | 0 | 1 | L1 | L2 |
| 1 | 1 | 0 | L2 | L0 |
| 1 | 1 | 1 | L2 | L1 |

2.25 BITS / CELL
BIT[8] = 0
(BINARY VALUE OF DATA PATTERN < 256)

| BITS[7:0] | [7:6] | [5:4] | [3:2] | [1:0] |
|---|---|---|---|---|
| CELLS[3:0] | CELL 3 | CELL 2 | CELL 1 | CELL 0 |

BIT[8] = 1
(BINARY VALUE OF DATA PATTERN ≥ 256)

| SWAP CELL | | | | |
|---|---|---|---|---|
| BITS[7:6] | CELL 3 | CELL 2 | CELL 1 | CELL 0 |
| 0 0 | BIT[1:0] | BIT[5:4] | BIT[3:2] | L4 |
| 0 1 | BIT[3:2] | BIT[5:4] | L4 | BIT[1:0] |
| 1 0 | BIT[5:4] | L4 | BIT[3:2] | BIT[1:0] |
| 1 1 | L4 | BIT[5:4] | BIT[3:2] | BIT[1:0] |

*Fig. 7B*

860-1 →   2.5 BITS / CELL
BIT[4] = 0  (< 16)

| BITS[3:0] | [3:2] | [1:0] |
|---|---|---|
| CELLS[1:0] | CELL 1 | CELL 0 |

BIT[4] = 1  (≥ 16)

| SWAP CELL | SWAP STATE | | |
|---|---|---|---|
| BIT[3] | BIT[2] | CELL 1 | CELL 0 |
| 0 | 0 | BIT[1:0] | L4 |
| 0 | 1 | BIT[1:0] | L5 |
| 1 | 0 | L4 | BIT[1:0] |
| 1 | 1 | L5 | BIT[1:0] |

*Fig. 8B*

DUAL MAPPING BETWEEN PROGRAM STATES AND DATA PATTERNS

PRIORITY INFORMATION

This application is a Continuation of U.S. application Ser. No. 13/780,499, filed Feb. 28, 2013, the contents of which are included herein by reference.

TECHNICAL FIELD

The present disclosure relates generally to semiconductor memory and methods, and more particularly, to dual mapping between program states and data patterns.

BACKGROUND

Memory devices are typically provided as internal, semiconductor, integrated circuits in computers or other electronic devices. There are many different types of memory including volatile and non-volatile memory. Volatile memory can require power to maintain its data (e.g., information) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, static random access memory (SRAM), resistance variable memory, such as phase change random access memory (PCRAM) and resistive random access memory (RRAM), and magnetic random access memory (MRAM), such as spin torque transfer random access memory (STT RAM), among others.

Flash memory devices, including floating gate flash devices and charge trap flash (CTF) devices can comprise memory cells having a storage node (e.g., a floating gate or a charge trapping structure) used to store charge and may be utilized as non-volatile memory for a wide range of electronic applications. Memory cells can be arranged in an array architecture and can be programmed to a desired state. For instance, electric charge can be placed on or removed from the storage node (e.g., floating gate) of a memory cell to place the cell into one of a number of program states. As an example, a single level cell (SLC) can be programmed to one of two program states which can represent a stored data unit (e.g., binary units 1 or 0). Various flash memory cells can be programmed to more than two program states, which can represent multiple stored data units (e.g., binary units 1111, 0111, 0011, 1011, 1001, 0001, 0101, 1101, 1100, 0100, 0000, 1000, 1010, 0010, 0110, or 1110). Such memory cells may be referred to as multi state cells, multiunit cells, or multilevel cells (MLCs). MLCs can allow the manufacture of higher density memories without increasing the number of memory cells since each cell can represent more than one digit (e.g., more than one bit).

Some MLCs can be programmed to a quantity (L) of program states that does not correspond to an integer number of stored data units. That is, the number of data units capable of being stored in a cell (e.g., $Log_2(L)$) can correspond to a fractional number of stored data units (e.g., a fractional number of bits).

BRIEF DESCRIPTION OF THE DRAWINGS

FIG. 4 is a table illustrating a number of dual mapping configurations in accordance with a number of embodiments of the present disclosure.

FIG. 5 is a table illustrating overhead associated with a dual mapping configuration in accordance with a number of embodiments of the present disclosure.

FIG. 6A illustrates a diagram including a constellation having a first and a second mapping shell and associated with dual mapping between data patterns and program states in accordance with a number of embodiments of the present disclosure.

FIGS. 6B-6C illustrate mappings between data patterns and program states in accordance with a number of embodiments of the present disclosure. The example shown in FIGS. 6B-6C supports two-dimensional (2D) mapping over two cells.

FIGS. 7A-7B illustrate mappings between data patterns and program states in accordance with a number of embodiments of the present disclosure. The example shown in FIGS. 7A-7B supports four-dimensional (4D) mapping over four cells.

FIGS. 8A-8B illustrate mappings between data patterns and program states in accordance with a number of embodiments of the present disclosure.

DETAILED DESCRIPTION

Figure 1:
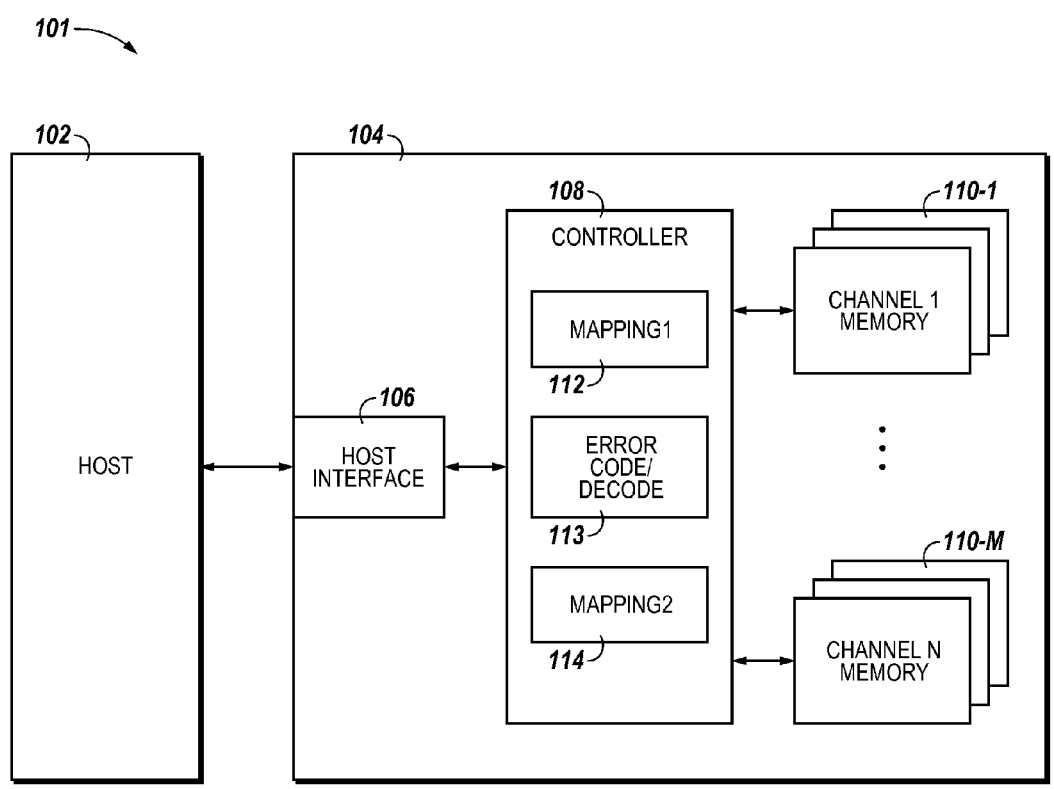
FIG. 1 is a block diagram of an apparatus in the form of a computing system including at least one memory system in accordance with a number of embodiments of the present disclosure.

The present disclosure includes methods and apparatuses for dual mapping between program states and data patterns. One apparatus includes a memory and a controller configured to control a dual mapping method comprising: performing a base conversion on a received data pattern and mapping a resulting base converted data pattern to one of a first number of program state combinations corresponding to a first group of memory cells; and determining a number of error data units corresponding to the base converted data pattern and mapping the number of error data units to one of a second number of program state combinations corresponding to a second group of memory cells. The error data units are mapped to the one of the second number of program state combinations corresponding to the second group of memory cells without being base converted.

Embodiments of the present disclosure can provide a dual mapping process in which user data units are mapped via a different mapping process than a mapping process used to map error data units (e.g., parity bits associated with error correction codes) corresponding to the user data units. As an example, the mapping process used to map the user data units can comprise base conversion, and the mapping used to map the error data units can be a substantially systematic mapping between program states and data patterns. Such dual mapping processes can provide different error propagation characteristics between user data and corresponding error data, for instance. A number of dual mapping embodiments of the present disclosure can provide benefits such as providing more effective fractional bit per cell mapping as compared to a number of previous approaches, among various other benefits. For example, a number of embodiments may be better suited for systems employing error detection and/or correction (e.g., systems employing error correction codes (ECC) such as low density parity check (LDPC) codes and Hamming codes, among others) and/or systems utilizing reliability data (e.g., soft data, such as log likelihood ratios (LLRs)) as compared to previous mapping algorithms.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M", "N", "n", "A", "B", "G", and "L," particularly with respect to reference numerals in the drawings, indicates that a number of the particular feature so designated can be included with a number of embodiments of the present disclosure. As used herein, "a number of" something can refer to one or more of such things.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 306 in FIG. 3A. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a block diagram of an apparatus in the form of a computing system 101 including at least one memory system 104 in accordance with a number of embodiments of the present disclosure. As used herein, a memory system 104, a controller 108, or a memory device 110 might also be separately considered an "apparatus". The memory system 104 can be a solid state drive (SSD), for instance, and can include a host interface 106, a controller 108 (e.g., a processor and/or other control circuitry), and a number of memory devices 110-1, . . . , 110-M (e.g., solid state memory devices such as NAND flash devices), which provide a storage volume for the memory system 104 and may be referred to herein as a memory 110. In a number of embodiments, the controller 108, the memory device 110, and/or the host interface 106 can be physically located on a single die or within a single package (e.g., a managed NAND application). Also, in a number of embodiments, a memory 110 can include a single memory device.

As illustrated in FIG. 1, the controller 108 can be coupled to the host interface 106 and to the memory 110 via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory 110 to control data read, write, and erase operations, among other operations. The controller 108 can include, for example, a number of components in the form of hardware and/or firmware (e.g., one or more integrated circuits) and/or software for controlling access to the memory 110 and/or for facilitating data transfer between the host 102 and memory 110. For instance, in the example illustrated in FIG. 1, the controller 108 includes a mapping component 112 (MAPPING1), an error code/decode component 113 (ERROR CODE/DECODE), and a mapping component 114 (MAPPING2). However, the controller 108 can include various other components not illustrated so as not to obscure embodiments of the present disclosure. Also, the components 112, 113, and/or 114 may not be components of controller 108, in some embodiments (e.g., the components 112, 113, and/or 114 can be independent components that may not be resident on controller 108).

The mapping components 112 and 114 can be used in association with mapping between memory cell program states and data in accordance with a number of embodiments described herein. As an example, the mapping component 112 can be used to perform an expansion process on a data pattern received thereto (e.g., a user data pattern received from host 102) and to map the expanded data pattern to one of a number program state combinations corresponding to a group of memory cells to which the expanded data pattern is to be stored. The error code/decode component 113 can be an error correction code encoder/decoder such as an LDPC encoder/decoder, for instance, which can encode/decode (e.g., with error data units such as parity bits) user data transferred between host 102 and the memory 110. The mapping component 114 can be configured to, for example, map error data generated by the error code/decode component 113 to one of a number of program state combinations corresponding to a group of cells to which the error data is to be stored. As described further below, in a number of embodiments, the group of memory cells used to store the user data pattern (e.g., which may be a base converted data pattern) are configured to store a first number of data units per cell and the group of memory cells used to store the error data are configured to store a second number of data units per cell, with the first number of data units per cell being different than the second number of data units per cell. In a number of embodiments, the first and/or second number of data units per cell is a non-integer number of data units. As used herein, a cell and/or a group of cells being "configured to store" a particular number of data units per cell does not limit the number of states to which a cell and/or the cells of a group of cells are programmable. For instance, it is noted that the memory cells of the group used to store the user data pattern and the memory cells of the group used to store the error data may each be programmable to a same number of states; however, the number the data units per cell that the cells are configured to store (e.g., the number of states to which the cells are programmable in accordance with a particular mapping) can depend on the particular mapping. As such, a group of cells being "configured to store" a particular number of data units per cell indicates the particular quantity of data units stored per cell and/or the quantity of available program states used in association with a particular mapping; however, the cells of the same group can be configured to store a different quantity of data units per cell and/or to use a different quantity of available program states in association with a different mapping scheme.

The memory 110 can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In embodiments in which the memory devices 110-1, . . . , 110-M comprise flash arrays having a NAND architecture, the arrays can comprise access lines (e.g., word lines) and intersecting data lines (e.g., bit lines). The arrays can comprise "strings" of memory cells connected in series source to drain between a source select gate configured to selectively couple a respective string to a common source and a drain select gate configured to selectively couple a respective string to a respective bit line. The memory cells can comprise, for instance, a source, a drain, a charge storage node (e.g., a floating gate), and a control gate, with the control gates of cells corresponding to a "row" of cells being commonly coupled to a word line. A NOR flash array would be similarly structured with the exception of strings of memory cells being coupled in parallel between select gates.

As one of ordinary skill in the art will appreciate, groups of flash cells coupled to a selected word line can be programmed and/or read together as a page of memory cells. A programming operation (e.g., a write operation), can include applying a number of program pulses (e.g., 16V-20V) to a selected word line in order to increase the threshold voltage (Vt) of selected cells coupled to that selected word line to a desired Vt level corresponding to a target (e.g., desired) program state. A read operation can include sensing a voltage and/or current change of a bit line coupled to a selected cell (e.g., responsive to a read voltage applied to the word line corresponding to the cell) in order to determine the program state of the selected cell.

As described further herein, in a number of embodiments of the present disclosure, a memory cell can be programmed to one of a quantity of program states corresponding to either an integer number of stored data units (e.g., bits) or a fractional number of stored data units. In a number of embodiments, the program states of a number of cells of a group of cells each storing a fractional number of bits can be combined such that the group of cells stores an integer number of bits. For instance, consider a group of cells each programmed to one of five program states, such that each cell can store 2.25 bits. In this example, the combined program states of a group of four cells corresponds to 9 bits (2.25 bits/cell×4 cells). That is, a 9 bit data pattern can be stored in the group of four cells. As such, controller 108 can control programming and/or reading a group of cells each storing a fractional number of bits per cell and can output (e.g., to host 102) an N unit data pattern stored in the group, where N is an integer number data units (e.g., bits). The particular data pattern (e.g., bit pattern) to which the combination of determined program states of the group corresponds can be determined based on a mapping algorithm in accordance with a number of embodiments described herein.

Figure 2:
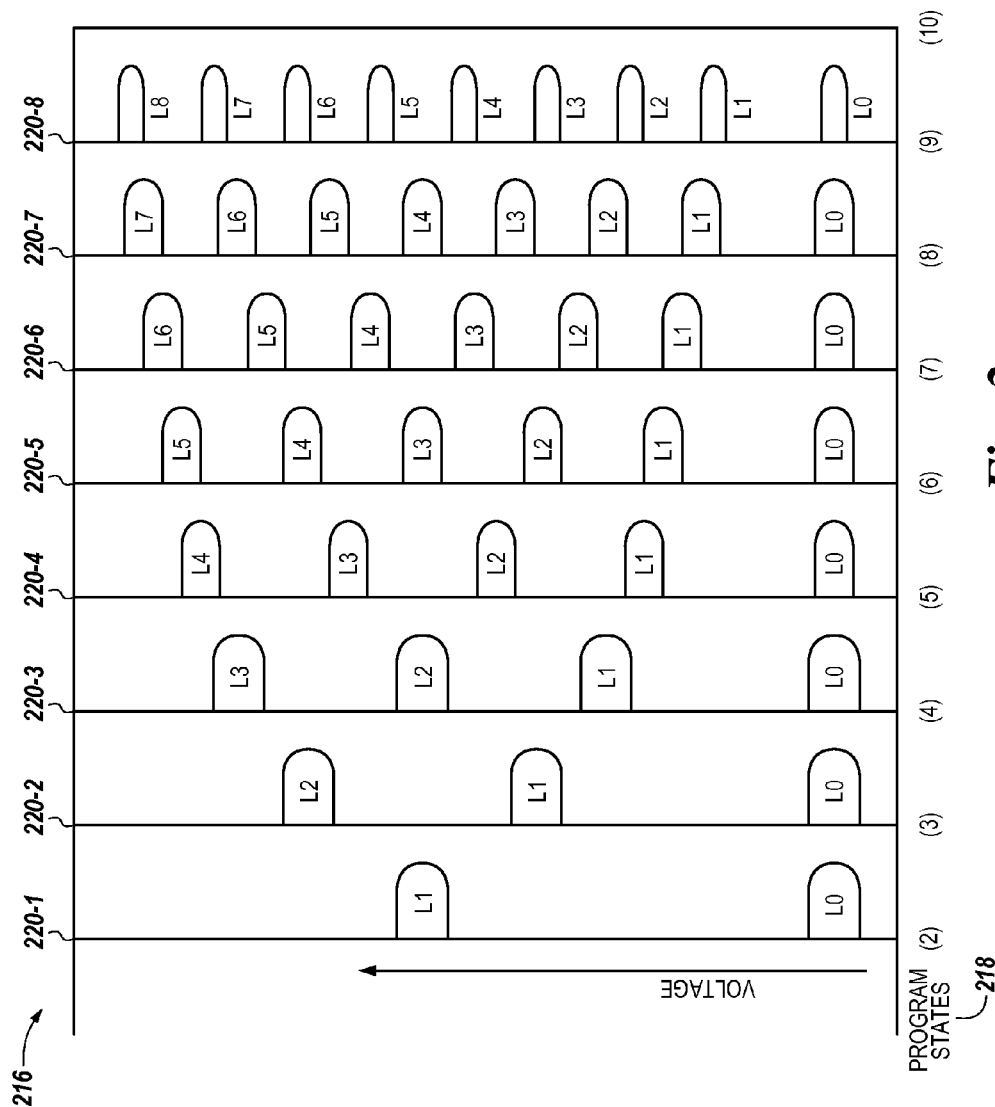
FIG. 2 is a diagram illustrating threshold voltages corresponding to program states of memory cells programmable to different numbers of program states in accordance with a number of embodiments of the present disclosure.

FIG. 2 is a diagram 216 illustrating threshold voltages corresponding to program states of memory cells programmable to different numbers of program states in accordance with a number of embodiments of the present disclosure. The memory cells can be NAND flash memory cells as described above and can be programmed to various Vt levels within a voltage range of about −2V to +3V; however, embodiments are not limited to a particular type of memory cell or to a particular operational voltage range (e.g., window).

Row 218 indicates the quantity of program states to which the memory cell may be programmed. The program states shown in FIG. 2 are labeled L0, L1, L2, etc., with each program state representing a distribution of Vt levels corresponding to the respective program states. In a number of embodiments, the program state L0 can be a lowermost program state (e.g., a program state corresponding to lowermost Vt levels) and may be referred to as an erase state since cells can be in a lowermost state after an erase operation; however, embodiments are not so limited.

In FIG. 2, column 220-1 corresponds to memory cells programmed to one of two different program states L0 and L1, and which can store one unit (e.g., bit) of data per cell. Column 220-2 corresponds to memory cells programmed to one of three different program states L0, L1, and L2, and which can store 1.5 units of data per cell. Column 220-3 corresponds to memory cells programmed to one of four different program states L0, L1, L2, and L3, and which can store 2 units of data per cell. Column 220-4 corresponds to memory cells programmed to one of five different program states L0 to L4, and which can store 2.25 units of data per cell. Column 220-5 corresponds to memory cells programmed to one of six different program states L0 to L5, and which can store 2.5 units of data per cell. Column 220-6 corresponds to memory cells programmed to one of seven different program states L0 to L6, and which can store 2.75 units of data per cell or 2.8 units of data per cell. Column 220-7 corresponds to memory cells programmed to one of eight different program states L0 to L7, and which can store 3 units of data per cell. Column 220-8 corresponds to memory cells programmed to one of nine different program states L0 to L8, and which can store 3.125 units of data per cell. Embodiments are not limited to these examples. For instance, in general, fractional unit cells can store log 2 (L) units/cell. The particular number of units stored per cell can depend on the particular mapping algorithm used, for example.

Memory cells programmable to a power of 2 quantity of program states (e.g., 2 program states, 4 program states, 8, program states, 16 program states, etc.) can individually store an integer number of bits per cell (e.g., $\log_2(L)$ bits/cell where L is the number of program states to which the cell is programmable). As such, the program state of each memory cell can be directly mapped to one of L different N bit data patterns where N is the integer quantity of bits stored in the cell. For instance, the program states of a cell programmable to two program states (L0 and L1) can be mapped to 0 or 1 (e.g., a 1 bit data pattern), the program states of a cell programmable to 4 program states (L0 to L3) can be mapped to 00, 01, 10, and 11, respectively (e.g., a 2 bit data pattern), and the program states of a cell programmable to 8 program states (L0 to L7) can be mapped to 000, 001, 010, 011, 100, 101, 110, and 111, respectively (e.g., a 3 bit data pattern).

In contrast, memory cells programmable to a non-power of 2 quantity of program states individually store a fractional (e.g., non-integer) number of bits per cell. As such, rather than program states of each individual cell mapping to an N bit data pattern, combinations of the L program states to which each individual cell of a group of cells is programmable are mapped to an N bit data pattern where N is an integer quantity of bits stored in the group. For instance, combinations of respective program states of a group of two memory cells programmable to three program states (L0, L1, and L2) (e.g., 1.5 bits/cell) are mapped to a 3 bit (e.g., 1.5 bits/cell×2 cells) data pattern (e.g., 000, 110, 100, etc.). Similarly, combinations of respective program states of a group of four memory cells programmable to five program states (L0 to L4) (e.g., 2.25 bits/cell) are mapped to a 9 bit (e.g., 2.25 bits/cell×4 cells) data pattern (e.g., 110011001, 000001111, 101010101, etc.), and combinations of respective program states of a group of eight memory cells programmable to 9 states (L0 to L8) (e.g., 3.125 bits/cell) are mapped to a 25 bit (e.g., 3.125 bits/cell×8 cells) data pattern (e.g., 0000011111000001111100000, 1010101010101010101010101, 1111111111111111110000000, etc.). As another example, a group of 4 cells programmable to seven program states (L0 to L6) (e.g., 2.75 bits/cell) can be mapped to an 11 bit (e.g., 2.75 bits/cell×4 cells) data pattern. Alternatively, a group of 5 cells programmable to seven program states (L0 to L6) (e.g., 2.8 bits/cell) can be mapped to a 14 bit (e.g., 2.8 bits/cell×5 cells) data pattern.

In general, for a group of cells collectively storing an integer number (N) of units of data (e.g., bits), but individually storing a fractional number of units of data, $2^N$ different N unit data patterns are mapped to a corresponding number (e.g., $2^N$) of different program state combinations of the group. As an example, consider a group of two cells each programmed to one of three program states (L0, L1, L2) such that the group collectively stores 3 bits of data (e.g., 1.5 bits/cell). As such, $2^3$ (e.g., 8) different 3 bit data patterns are mapped to $2^3$ (e.g., 8) different program state combinations of the group.

In a number of embodiments, a constellation (e.g., an L×L square constellation where L is the quantity of program states to which a cell is programmable) can be used to represent the different possible program state combinations associated with a group of fractional unit memory cells. For instance, each possible program state combination can correspond to a different constellation point, which can be mapped to a particular N unit data pattern, where N is the integer quantity of data units stored in the group of cells. For this 2-dimensional example constellation, the quantity of program state combinations (e.g., the quantity of constellation points) can equal $L^2$, which must be greater than or equal to the $2^N$ different N unit data patterns corresponding to the N quantity of data units stored in the group of cells. As such, one or more of the $L^2$ program state combinations may not be mapped to an N unit data pattern, or one or more of the $L^2$ program state combinations may be mapped to a same one of the N unit data patterns as one or more others of the $L^2$ program state combinations. An example of a mapping constellation in accordance with a number of embodiments of the present disclosure is described below in connection with FIG. 6A. In a number of embodiments, a group of fractional bit cells collectively storing an integer number of bits comprises more than two cells. In such embodiments, the quantity of program state combinations (e.g., the quantity of constellation points) can be greater than $L^2$.

The particular mappings between data patterns to respective program state combinations corresponding to groups of fractional unit (e.g., fractional bit) memory cells vary. That is, the manner in which program state combinations are assigned to the data patterns may not be uniform. For instance, in a number of embodiments, user data can be mapped via a mapping process different from the mapping process used to map the error data (e.g., parity bits) corresponding to the user data. For instance, in a number of embodiments, an expansion process (e.g., a base conversion) can be performed on a user data pattern in association with mapping user data patterns to particular program state combinations.

However, such expansion (e.g., code expansion via base conversion) can result in an increase in error data (e.g., ECC) redundancy as an increased number of parity bits result from the increased amount of user data bits (e.g., due to expansion via base conversion). Some mapping processes can effectively and efficiently map between data patterns and program states without performing a code expansion, for instance. However, such mapping processes may result in an increase in error multiplication and/or propagation (which results in an increased error rate provided to an ECC decoder) and may increase the complexity associated with reliability data (e.g., soft data) generation and/or analysis, for example. The amount of increase in error multiplication and/or propagation may depend on factors such as the number of bits stored per cell and/or the number of program states to which the cells are programmed, among other factors. A number of embodiments of the present disclosure can provide decreased complexity and/or can reduce and/or prevent error multiplication and/or propagation as compared to previous approaches, among other benefits.

Figure 3:
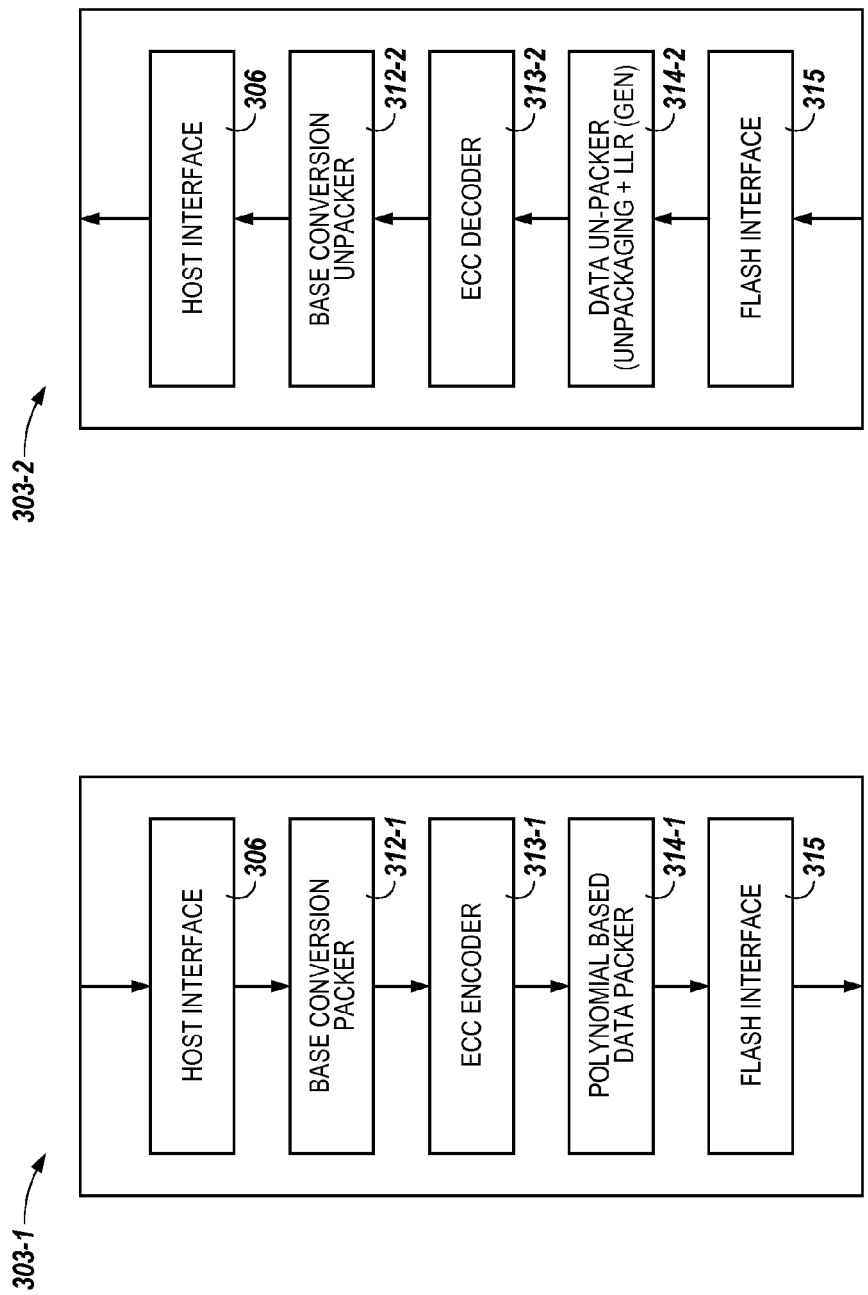
FIG. 3A is a functional block diagram illustrating an encode data path associated with dual mapping between data patterns and program states in accordance a number of embodiments of the present disclosure.
FIG. 3B is a functional block diagram illustrating a decode data path associated with dual mapping between data patterns and program states in accordance a number of embodiments of the present disclosure.

FIG. 3A is a functional block diagram illustrating an encode data path 303-1 associated with dual mapping between data patterns and program states in accordance a number of embodiments of the present disclosure. A data pattern (e.g., a user data pattern) can be received by a host interface 306. The data pattern is provided to a mapping component 312-1 (BASE CONVERSION PACKER). In this example, the mapping component 312-1 performs a base conversion on the data pattern and maps the base converted data pattern to one of a number of program state combinations corresponding to a first group of memory cells. The first group of memory cells can each be configured to store a fractional number of data units per cell such that the group stores an integer number of bits, and the quantity of memory cells in the first group may be based on the number of program states to which the first group of memory cells are configured to be programmed. For instance, since the maximum number of data units (e.g., bits) storable per cell is equal to $\log_2 (L)$, where L is the number of program states, a group of five cells each programmable to one of seven program states may be used to store 2.8 bits/cell (2.8 bits/cell×5 cells=14 bits). Base converting the received data pattern can result in expanding the data pattern to an increased number of data units. For instance, in this example, each 14 bit data pattern received by mapping component 312-1 can be converted to five three-bit base-7 numbers represented by 15 bits, and each of the five three-bit base-7 numbers can be mapped to one of the seven program states to which the first group of cells are programmable. Embodiments are not limited to this example, and other examples will be described below in association with FIG. 4. Although an expansion factor is associated with mapping via base conversion (e.g., more parity bits are generated as compared to a case without expansion), the amount of error propagation associated with the mapping can be reduced as compared to other mapping methods. For instance, since base conversion is performed prior to ECC encoding, at the read path, unpacking for base conversion is performed after ECC decoding such that the decoded data sequence has no (or very few) errors.

An error code/decode component 313-1 is shown in the data path 303-1. In this example, the component 313-1 is an ECC encoder that receives the base converted data pattern from mapping component 312-1. The ECC encoder 313-1 can generate parity bits based on the base converted data pattern and add the parity bits to the base converted data pattern such that a codeword to be written to memory comprises a number of base converted data patterns and their respective parity bits.

The data path 303-1 also includes a mapping component 314-1. In this example, the component 314-1 is a polynomial based data packer. The polynomial based data packer can be configured to map a number of error data units (e.g., the parity bits) corresponding to the base converted data pattern to one of a number of program state combinations corresponding to a second group of memory cells. The second group of memory cells can be configured to store a fractional number of data units per cell. In a number of embodiments, the group of memory cells configured to store the error data units store fewer data units per cell than that of the group of memory cells configured to store the base converted user data units. In a number of embodiments, the number of error data units are mapped to the one of the number of program state combinations corresponding to the second group of memory cells without being base converted. In some such embodiments, the error data units do not have an expansion factor associated therewith. Since the base conversion of the user data occurs prior to the ECC encoding, error propagation which may be associated with the polynomial based data packer 314-1 can be eliminated with respect to the user data.

As described further below, in a number of embodiments, a polynomial based mapping method can have a mapping constellation associated therewith that comprises at least a first mapping shell and a second mapping shell. The polynomial based mapping between program state combinations and data patterns can be based on a polynomial expression of order G, where G is a quantity of fractional unit cells combined to store an integer number of data units corresponding to a data pattern. In a number of embodiments, a first term of the polynomial expression corresponds to a first mapping shell and a second term of the polynomial expression corresponds to a second mapping shell, with each mapping shell corresponding to a number of constellation points. As an example, the polynomial expression on which the mapping is based can be the expression $(A+B)^G$, with $A^G$ being the first term and corresponding to a quantity of constellation points of the first mapping shell, and $G \times A^{(G-1)} \times B$ being the second term and corresponding to a quantity of constellation points of the second mapping shell. As described further below, A can be the quantity of program states from which the respective program state combinations corresponding to the first mapping shell are determined and B can be the quantity of additional program states (e.g., an additional quantity of the L program states) from which the respective program state combinations corresponding to the second mapping shell are determined. As such, in embodiments in which two mapping shells are used, A+B is equal to the quantity of program states to which the memory cells are programmable. As an example, A can be equal to $2^a$ with "a" being a value such that $2^a$ is an uppermost power of 2 that is less than the quantity of program states (e.g., L) to which the memory cells are programmable. For instance, for cells programmable to 6 different program states and storing 2.5 bits/cell, A can be equal to 4, since $2^2$ is the uppermost power of 2 that is less than 6. If A is equal to 4, B can be equal to 2 (e.g., 6−4). As such, the quantity of program states from which the respective program state combinations corresponding to the first mapping shell are determined is four (e.g., A=4). That is, only combinations of the first four program states (e.g., L0 to L3) of the six program states (e.g., L0 to L5) to which the memory cells are programmable, correspond to constellation points of the first mapping shell. In this example, the quantity of additional program states from which the respective program state combinations corresponding to the second mapping shell are determined is two (e.g., B=2). As such, only combinations comprising at least one of the last two program states (e.g., L4 and L5) of the six program states (e.g., L0 to L5) to which the memory cells are programmable, correspond to constellation points of the second mapping shell. In a number of embodiments, the A program states corresponding to the first mapping shell comprise the lowermost A program states of the L program states (e.g., the program states corresponding to the lowermost Vt levels), and the B program states corresponding to the second mapping shell comprise program states other than the lowermost A program states.

A memory interface 315 (e.g., Flash Interface) is shown in data path 303-1 of FIG. 3A and 303-2 of FIG. 3B. The memory interface 315 can serve as the interface between a memory such as memory 110 and a controller such as controller 108 shown in FIG. 1, for example.

FIG. 3B is a functional block diagram illustrating a decode data path 303-2 associated with dual mapping between data patterns and program states in accordance with a number of embodiments of the present disclosure. A read operation can be performed on respective groups of memory cells storing user data (e.g., base converted user data) and corresponding error data. A mapping component 314-2 (e.g., Data Un-Packer) can determine reliability data (e.g., soft data such as log likelihood ratios (LLRs)) corresponding to the base converted user data bits as well as for the corresponding error data (e.g., parity bits) based on the read program states of the respective groups of memory cells. The LLR determinations can be one-dimensional (1D) computations for the user data bits since they are in the base converted domain (e.g., three bits per cell for the example above in which each cell storing user data is programmed to one of eight program states). However, the LLR determinations can be more complex for the parity bits since the mapping (e.g., polynomial based) of the parity bits may involve multidimensional swapping, as described further below.

After the data units stored in the groups of memory cells have been determined (e.g., based on the read operation), and the LLRs corresponding thereto have been determined, an error code/decode component 313-2 can be used to check for and/or correct errors in the data. In this example, the error code/decode component is an ECC decoder 313-2. After the ECC decoder 313-2 has operated on the data, the base converted data pattern corresponding to the user data can be mapped back to the non-base converted data pattern (e.g., unpacked) via mapping component 312-2 (BASE CONVERSION UNPACKER) prior to being returned to a host (e.g., host 102 shown in FIG. 1) via host interface 306.

FIG. 4 is a table 435 illustrating a number of dual mapping configurations 439-1, 439-2, 439-3, and 439-4 in accordance with a number of embodiments of the present disclosure. Table 435 corresponds to embodiments in which user data 437 is mapped via base conversion and corresponding parity data 438 is mapped via a polynomial based mapping such as those described herein, for example. The different mapping configurations 439-1, 439-2, 439-3, and 439-4 of table 435 correspond to the quantity of program states per cell (Levels/Cell) storable by a particular memory array (e.g., flash array).

As shown in table 435, configurations 439-1, 439-2, 439-3, and 439-4 correspond to a memory array storing 7 program states/cell, 11 program states/cell, 13 program states/cell, and 14 program states/cell, respectively. As noted above, the maximum data units (e.g., bits) storable per cell is given by $Log_2(L)$, where L is the number of program states. The maximum number of bits storable per cell (Max Bits/Cell) for configurations 439-1, 439-2, 439-3, and 439-4 are shown in table 435. Table 435 also indicates the actual number of user bits stored per cell (Stored Bits/Cell) for each of the configurations (e.g., 2.8 for configuration 439-1, 3.4 for configuration 439-2, 3.6 for configuration 439-3, and 3.8 for configuration 439-4. Table 435 also indicates the number of cells (# of Cells) in a group of cells used to store an integer number of user data bits. In this example, a group of 5 cells is used to store the user data bits for each of the configurations 439-1, 439-2, 439-3, and 439-4. The user data bits are grouped such that for configuration 439-1, a group of 5 cells stores 2.8 bits/cell×5 cells (e.g., 14 bits), for configuration 439-2, a group of 5 cells stores 3.4 bits/cell×5 cells (e.g., 17 bits), for configuration 439-3, a group of 5 cells stores 3.6 bits/cell×5 cells (e.g., 18 bits), and for configuration 439-4, a group of 5 cells stores 3.8 bits/cell×5 cells (e.g., 19 bits).

In accordance with a number of embodiments, the quantity of user data bits stored per group (Bits/Group (Native)) are expanded via base conversion such that each group of 5 cells stores a higher quantity of user data bits (shown as Bits/Group (Base Converted) in table 435). In this example, the 14 user data bits stored per group (e.g., a 14 bit data pattern) in association with configuration 439-1 are converted to five 3-bit base-7 numbers represented by 15 bits, the 17 user data bits stored per group in association with configuration 439-2 are converted to five 4-bit base-11 numbers represented by 20 bits, the 18 user data bits stored per group in association with configuration 439-3 are converted to five 4-bit base-13 numbers represented by 20 bits, and the 19 user data bits stored per group in association with configuration 439-2 are converted to five 4-bit base-14 numbers represented by 20 bits. Considering configuration 439-1, each of the five converted 3-bit base-7 numbers would indicate to which one of the seven program states a particular cell of the five cells of the group maps. As an example, (a 3-bit pattern 000 may map to a first program state (L0), 001 may map to program state L1, 010 may map to program state L2, 011 may map to program state L3, 100 may map to program state L4, 101 may map to program state L5, and 110 may map to program state L6). Embodiments are not limited to this example. For instance, the respective mappings between 3-bit base-7 numbers and particular program states may be different and base conversion to a base other than base-7 (e.g., base 14) may be used. For instance, a number of bits can be converted to a number of base-X data units, where X is greater than two, and wherein the value of X is based, at least partially, on a quantity of program states to which the memory cells of a group are programmable.

In the example described in association with FIG. 4, the base conversion performed on the user data bits results in an expansion factor as shown in table 435. For instance, the expansion factors corresponding to configurations 439-1, 439-2, 439-3, and 439-4 are 7%, 18%, 11%, and 5%, respectively. For instance, the expansion factor associated with configuration 439-1 can be determined by dividing the number of data bits after base conversion (e.g., 15 bits) by the number of user data bits prior to base conversion (e.g., 14 bits). Since 15/14=1.07, the user data is expanded by 7%. As described above, in a number of embodiments, the user data bits to be stored in a group of memory cells undergo base conversion prior to generation of the error data (e.g., parity data) via an ECC encoder, for example. Therefore, due to the expansion resulting from the base conversion process, more parity bits are generated than would be otherwise generated (e.g., if the user bits were not expanded via base conversion or were error encoded prior to base conversion, for instance). It is noted that expansion of the user data does not result in an increased number of cells being used to store the user data. That is, if the user data were not expanded, the quantity of cells used to store the unexpanded user data would be the same as the quantity of cells used to store the expanded user data.

As described above, in a number of embodiments, the parity data corresponding to user data to be stored in a memory array can be mapped to one of a number of program state combinations corresponding to a group of memory cells to which the parity data (e.g., bits) are to be stored. In a number of embodiments, the group of memory cells to which the expanded (e.g., base converted) user data bits are to be stored are configured to store a different number of bits/cell than the group of cells to which the parity bits are to be stored. In a number of embodiments, the group of cells storing parity bits are configured to store fewer bits/cell than the group of cells storing the user data bits. For instance, as shown in table 435, the cells storing parity bits in association with configuration 439-1 store 2.5 bits/cell as compared to 2.8 bits/cell stored by cells storing the user bits, the cells storing parity bits in association with configuration 439-2 store 3.25 bits/cell as compared to 3.4 bits/cell stored by cells storing the user bits, the cells storing parity bits in association with configuration 439-3 store 3.5 bits/cell as compared to 3.6 bits/cell stored by cells storing the user bits, and the cells storing parity bits in association with configuration 439-4 store 3.5 bits/cell as compared to 3.8 bits/cell stored by cells storing the user bits.

In a number of embodiments, the parity bits are not base converted. That is, the parity bits do not undergo a code expansion. In a number of embodiments, the parity bits are mapped based on a mapping constellation comprising at least a first mapping shell and a second mapping shell (e.g., via a polynomial based mapping process), examples of which are described further below in association with FIGS. 6A to 8B.

FIG. 5 is a table 545 illustrating overhead associated with a dual mapping configuration in accordance with a number of embodiments of the present disclosure. The example provided in table 545 corresponds to a dual mapping configuration corresponding to memory cells programmable to seven program states per cell such as configuration 439-1 described above in association with FIG. 4.

Table 545 indicates that in order to store 16,384 bits of user data (User) in a group of cells storing 2.8 bits/cell, the quantity of cells in the group is 5,852 cells. Converting the 16,384 user data bits to base-7 requires 17,555 bits (Expanded User) (e.g., 16,384 bits×15/14), which can be stored in the same number of cells (e.g., 5,852) with each three bits representing one of the seven program states.

For 10% ECC parity overhead, 1,951 parity bits are generated for the 17,555 base converted bits. In this example, the parity bits are stored in 2.5 bit/cell memory cells such that a group of 781 cells (e.g., 1,951 bits/2.5 bits/cell) are needed to store the parity bits. As such, the codeword (e.g., base converted user data bits and corresponding parity bits) comprises 19,506 bits (e.g., 17,555 user bits+1,951 parity bits), and a total of 6,633 cells (5,852 cells for user data+781 cells for parity data) are needed to store the codeword. As shown in table 545, the ECC overhead in terms of bits due to this example dual mapping configuration is 0.16 (16%) (e.g., 1−16,384/19,506). That is, although 10% overhead is allotted for ECC parity, the dual mapping in this example results in an overall bit increase of about 16% resulting from the expansion factor (e.g., due to base conversion of the user data) and the additional parity bits resulting therefrom (e.g., due to the larger ECC encoder input). The dual mapping configuration of this example also results in an increase in the number of cells used to store the base converted user data and corresponding parity data of about 1.77% (e.g., 1-5,852/6,633) as compared to a mapping configuration in which the user data bits are not base converted, for instance. However, a number of dual mapping embodiments described herein can provide benefits such as reducing and/or eliminating error propagation over user data as compared to previous mapping approaches.

As described above, in a number of embodiments, a polynomial based mapping method can be used to map error data corresponding to particular user data (e.g., user data mapped via base conversion). The polynomial based mapping can have a mapping constellation associated therewith that comprises at least a first mapping shell and a second mapping shell such as that shown in FIG. 6A.

A polynomial based mapping process can be implemented by a mapping component such as mapping component 114 described in FIG. 1 and mapping components 314-1/314-2 described in FIGS. 3A/3B. In such mappings, a symbol size can refer to a quantity of bits stored per cell multiplied by a minimum quantity of cells needed to store an integer number of bits. For instance, if a group of memory cells store 1.5 bits/cell, then the minimum number of cells needed to store an integer number of bits is 2 cells, which corresponds to a symbol size of 3 bits (e.g., 1.5 bits/cell×2 cells). A symbol size of N bits (e.g., N parity bits) indicates that $2^N$ different N bit data patterns are to be mapped (e.g., assigned) to $2^N$ respective program state combinations (e.g., $2^N$ constellation points) corresponding to a group of cells.

second cell of the group) is programmable. As such, the constellation of FIG. 6A includes nine constellation points corresponding to the nine possible program state combinations (cell 0 state; cell 1 state) (e.g., (L0; L0), (L0; L1), (L0; L2), (L1; L0), (L1; L1), (L1; L2), (L2; L0), (L2; L1), and (L2; L2)).

Table 1 shown below provides configuration information associated with the example described in connection with FIGS. 6A-6C. Table 1 indicates the quantity of bits stored per cell ("bpc") (e.g., 1.5), the quantity of states ("States") to which the memory cells are programmable (e.g., 3), the quantity of cells ("Cells/nD") corresponding to an N bit data pattern (e.g., 2), N corresponding to a symbol size, the quantity of constellation points ("Constellation points") needed to map to $2^N$ program state combinations (e.g., 8), the quantity of program states used to form program state combinations corresponding to the first mapping shell ("First shell states") (e.g., 2), the quantity of constellation points of the first mapping shell ("First shell points") (e.g., 4), the quantity of additional program states used to form program state combinations corresponding to the second mapping shell ("Second shell states")(e.g., 1), the quantity of constellation points of the second mapping shell ("Second shell points") (e.g., 4), and the packing density ("Packing density") (e.g., 88.89%). The packing density is equal to $(2^{bpc \times nD})/(L^{nD})$ where bpc is the quantity of bits/cell stored in a group of quantity nD cells, with bpc×nD corresponding to an the symbol size (e.g., N bits), and L is the quantity of program states to which the group of cells are programmable.

TABLE 1

| bpc | States | Cells/nD | Constellation points | First shell states | First shell points | Second shell additional states | Second shell points | Packing density |
|---|---|---|---|---|---|---|---|---|
| 1.5 | 3 | 2 | 8 | 2 | 4 | 1 | 4 | 88.89% |

As described above, a polynomial expression (e.g., $(A+B)^G$) can be used to determine the quantity of mapping shells needed for mapping data patterns of the determined symbol size to the $2^N$ respective program state combinations, as well as to determine to which of the number of mapping shells a particular N bit data pattern corresponds. As described further below, in a number of embodiments, a MSB (most significant bit) of a data pattern (e.g., of an N bit symbol) is used to determine whether or not the data pattern maps to the first mapping shell. For example, an MSB of "0" can indicate the data pattern maps to the first mapping shell, and an MSB of "1" can indicate the data pattern maps to a higher order mapping shell (e.g., a $2^{nd}$ or $3^{rd}$ mapping shell, etc.). A polynomial based mapping component can map the bits assigned to the respective cells of the group of G cells (e.g., "dimensions") to respective program states.

FIG. 6A illustrates a diagram 650 including a constellation having a first and a second mapping shell associated with mapping between data patterns and program states in accordance with a number of embodiments of the present disclosure. Diagram 650 represents a constellation (e.g., a square constellation) associated with a group of two cells (e.g., cell 0 and cell 1) storing 3 bits of data (e.g., 1.5 bits/cell) such that a corresponding symbol size is 3 bits, which can be represented as [2:0]. Row 651 illustrates the three program states (e.g., L0, L1, and L2) to which cell 0 (e.g., a first cell of the group) is programmable and column 652 illustrates the three program states (e.g., L0, L1, and L2) to which cell 1 (e.g., a Therefore, in the example shown in FIG. 6A, the quantity of constellation points, and hence the quantity of different program state combinations is 9, which is one greater than the quantity of data patterns needed to represent the 8 different N bit (e.g., 3 bit) data patterns (e.g., $2^N$). As such, as shown in FIG. 6A, the constellation point corresponding to the program state combination (L2; L2) is not mapped to a data pattern (e.g., as indicated by an "x" in diagram 650). As such, the packing density is less than 100%. In general, a higher packing density corresponds to a higher utilization of memory capacity (e.g., flash capacity). In a number of embodiments, those one or more program state combinations which are not mapped to a data pattern correspond to higher program state combinations (e.g., those combinations including program states corresponding to higher Vt levels), which can provide benefits such as preventing charge loss effects associated with higher program states.

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 1.5 bits/cell example of FIG. 6A, A is equal to 2, G is equal to 2, and B is equal to 1. As such, $A^G$ is equal to 4 and $G \times A^{(G-1)} \times B$ is equal to 4. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 2 program states (e.g., L0 and L1) are mapped to the respective 4 constellation points of the first mapping shell and the 4 constellation points of the second mapping shell map to program state combinations that include the uppermost program state (e.g., L2). That is, program state combinations of the second mapping shell include one cell having program state L0 or L1, and one cell having program state L2.

As shown in FIG. 6A, the 4 constellation points of the first mapping shell are numbered 0 to 3 and correspond to the respective program state combinations (L0; L0), (L0; L1), (L1; L0), and (L1; L1). The 4 constellation points of the second mapping shell are numbered 4 to 7 and correspond to the respective program state combinations (L2; L0), (L2; L1), (L0; L2), and (L1; L2). The decimal values 0 to 7 correspond to the respective 3 bit data patterns 000 to 111.

FIGS. 6B and 6C illustrate a manner in which the different 3 bit data patterns are mapped to the program state combinations corresponding to the first and second mapping shells, respectively. Diagram 660-1 illustrates mappings corresponding to the first mapping shell and diagram 660-2 illustrates mappings corresponding to the second mapping shell. In this example, the MSB (e.g., bit[2]) of the 3 bit data pattern (e.g., represented as bit[2:0]) indicates whether the data pattern maps to the first shell or the second shell. For instance, if bit[2] is "0" (e.g., the binary value of the 3 bit data pattern is less than 4), the data pattern maps to the first shell, and if bit[2] is "1" (e.g., the binary value of the 3 bit data pattern is greater than or equal to 4), the data pattern maps to the second shell.

The mappings of FIG. 6B corresponding to the first mapping shell are systematic (e.g., they can then be determined in a systematic manner). For instance, bit[1] can be assigned to cell[1] and bit[0] can be assigned to cell[0] (the cells represented as cells[1:0]). That is, as shown in FIG. 6B, the binary values of bits[1:0] of the data pattern [2:0] correspond directly to the program states of cells[1:0] (e.g., a binary value of "1" corresponding to program state L1 and a binary value of "0" corresponding to program state L0).

The mappings of FIG. 6C corresponding to the second mapping shell are near systematic (e.g., they can be determined in a substantially systematic manner). The mappings corresponding to the second mapping shell are not entirely systematic since, unlike the first mapping shell, the binary values of bits [1:0] of the 3 bit data pattern (e.g., symbol size) do not correspond directly to the program states of respective cells[1:0]. As noted above, for the second mapping shell, one of cells[1:0] carries program state L2. In this example, bit[1] is used to determine which of cells[1:0] carries L2 (e.g., a binary value of "0" for bit[1] indicates cell[0] carries L2 and a binary value of "1" for bit[1] indicates cell[1] carries L2. A bit(s) used to determine which cell carries the one or more of a number of program states not corresponding to a first mapping shell can be referred to herein as a "swap cell bit(s)," and the cell that carries the one or more of the number of program states not corresponding to the first mapping shell can be referred to herein as a "swap cell." In this example, bit[1] is the swap cell bit. As such, if bit[1] is "0," cell[0] is the swap cell and if bit[1] is "1," cell[1] is the swap cell. As in the first shell mapping of FIG. 4B, in FIG. 4C, the binary value of bit[0] does correspond directly with program states L0 and L1 (e.g., a value of "0" corresponds to L0 and a value of "1" corresponds to L1). However, when cell[0] is the swap cell, bit[0] is assigned to cell[1] and when cell[1] is the swap cell, bit[0] is assigned to cell[0]. As such, FIGS. 6B and 6C illustrate a manner in which the different 3 bit data patterns corresponding to a first and a second mapping shell are mapped to respective program state combinations of a group of two memory cells each storing 1.5 bits/cell in accordance with a number of embodiments of the present disclosure.

Table 2 shown below provides configuration information associated with the example described in connection with FIGS. 7A and 7B. Table 2 indicates the quantity of bits stored per cell ("bpc") (e.g., 2.25), the quantity of states ("States") to which the memory cells are programmable (e.g., 5), the quantity of cells ("Cells/nD") corresponding to an N bit data pattern (e.g., 4), N corresponding to a symbol size (e.g., 9 bits in this example), the quantity of constellation points ("Constellation points") needed to map to $2^N$ program state combinations (e.g., 512), the quantity of program states used to form program state combinations corresponding to the first mapping shell ("First shell states") (e.g., 4), the quantity of constellation points of the first mapping shell ("First shell points") (e.g., 256), the quantity of additional program states used to form program state combinations corresponding to the second mapping shell ("Second shell states")(e.g., 1), the quantity of constellation points of the second mapping shell ("Second shell points") (e.g., 256), and the packing density ("Packing density") (e.g., 81.92%).

TABLE 2

| bpc | States | Cells/nD | Constellation points | First shell states | First shell points | Second shell additional states | Second shell points | Packing density |
| --- | --- | --- | --- | --- | --- | --- | --- | --- |
| 2.25 | 5 | 4 | 512 | 4 | 256 | 1 | 256 | 81.92% |

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 2.25 bits/cell example of FIGS. 7A and 7B, A is equal to 4, G is equal to 4, and B is equal to 1. As such, $A^G$ is equal to 256 and $G \times A^{(G-1)} \times B$ is equal to 256. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 4 program states (e.g., L0 to L3) are mapped to the respective 256 constellation points of the first mapping shell and the 256 constellation points of the second mapping shell map to program state combinations that include a program state other than the first 4 program states (e.g., the uppermost program state L4). As shown in FIG. 7B, in this example, program state combinations of the second mapping shell include each of three cells having one of program states L0 to L3, and one cell carrying program state L4.

FIGS. 7A and 7B illustrate a manner in which the different 9 bit data patterns are mapped to the program state combinations corresponding to the first and second mapping shells, respectively. Diagram 760-1 illustrates mappings corresponding to the first mapping shell and diagram 760-2 illustrates mappings corresponding to the second mapping shell. In this example, the MSB (e.g., bit[8]) of the 9 bit data pattern (e.g., represented as bit[8:0]) indicates whether the data pattern maps to the first shell or the second shell. For instance, if bit[8] is "0" (e.g., the binary value of the 9 bit data pattern is less than 256), the data pattern maps to the first shell, and if bit[8] is "1" (e.g., the binary value of the 9 bit data pattern is greater than or equal to 256), the data pattern maps to the second shell.

FIG. 7A illustrates how the bits[7:0] of the 9 bit data pattern can be mapped to program state combinations of the four cells[3:0] systematically for the first mapping shell. For instance, bits [7:6] can be assigned to cell[3], bits[5:4] can be assigned to cell[2], bits[3:2] can be assigned to cell[1], and bits[1:0] can be assigned to cell[0], with the binary values of the bit pairs assigned to the cells corresponding directly to the program states of the respective cells (e.g., with the binary values "00," "01," "10," and "11," corresponding directly to L0, L1, L2, and L3, respectively).

FIG. 7B illustrates how the bits [7:0] of the 9 bit data pattern can be mapped to program state combinations of the four cells[3:0] for the second mapping shell. As noted above, for program state combinations of the second mapping shell, one of cells[3:0] carries program state L4. In this example, bits[7:6] are used to determine which of cells[3:0] carries program state L4 (e.g., a binary value of "00" for bits[7:6] indicates cell[0] carries L4, a binary value of "01" for bits[7:6] indicates cell[1] carries L4, a binary value of "10" for bits [7:6] indicates cell[2] carries L4, and a binary value of "11" for bits[7:6] indicates cell[3] carries L4. That is, bits [7:6] are the swap bits for this 2.25 bits/cell example. As such, as shown in FIG. 7B, if bits[7:6] are "00," cell[0] is the swap cell, if bits[7:6] are "01," cell[1] is the swap cell, if bits[7:6] are "10," cell[2] is the swap cell, and if bits[7:6] are "11," cell[3] is the swap cell. FIG. 7B also indicates the bit assignments for the three cells that do not carry L4. For instance, as illustrated, if bits [7:6] of the 9 bit data pattern are "00" such that cell[0] carries L4, then bits [3:2] are assigned to cell[1], bits [5:4] are assigned to cell [2], and bits [0:1] are assigned to cell[3]. In the second mapping shell, the bit pairs [5:4], [3:2], and [1:0] of the 9 bit data pattern each correspond directly to the program states L0 to L3. For instance, a 9 bit data pattern of 100100111 having bits[7:6] being "00," bits[5:4] being "10," bits[3:2] being "01," and bits[1:0] being "11," maps to cell[0] being programmed to program state L4, cell[1] being programmed to program state L1, cell[2] being programmed to program state L2, and cell[3] being programmed to program state L3 in accordance with the second shell mapping illustrated in FIG. 7B. The mapping corresponding to the second shell is near systematic. For instance, two of the four cells corresponding to the mapping carry systematic information all of the time.

As such, FIGS. 7A and 7B illustrate a manner in which the different 9 bit data patterns corresponding to a first and a second mapping shell are mapped to respective program state combinations of a group of four memory cells each storing 2.25 bits/cell in accordance with a number of embodiments of the present disclosure.

Table 3 shown below provides configuration information associated with the example described in connection with FIGS. 8A and 8B. Table 3 indicates the quantity of bits stored per cell ("bpc") (e.g., 2.5), the quantity of states ("States") to which the memory cells are programmable (e.g., 6), the quantity of cells ("Cells/nD") corresponding to an N bit data pattern (e.g., 2), N corresponding to a symbol size (e.g., 5 bits in this example), the quantity of constellation points ("Constellation points") needed to map to $2^N$ program state combinations (e.g., 32), the quantity of program states used to form program state combinations corresponding to the first mapping shell ("First shell states") (e.g., 4), the quantity of constellation points of the first mapping shell ("First shell points") (e.g., 16), the quantity of additional program states used to form program state combinations corresponding to the second mapping shell ("Second shell states")(e.g., 2), the quantity of constellation points of the second mapping shell ("Second shell points") (e.g., 16), and the packing density ("Packing density") (e.g., 88.89%).

TABLE 3

| bpc | States | Cells/nD | Constellation points | First shell states | First shell points | Second shell additional states | Second shell points | Packing density |
|---|---|---|---|---|---|---|---|---|
| 2.5 | 6 | 2 | 32 | 4 | 16 | 2 | 16 | 88.89% |

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 2.5 bits/cell example of FIGS. 8A and 8B, A is equal to 4, G is equal to 2, and B is equal to 2. As such, $A^G$ is equal to 16 and $G \times A^{(G-1)} \times B$ is equal to 16. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 4 program states (e.g., L0 to L3) are mapped to the respective 16 constellation points of the first mapping shell and the 16 constellation points of the second mapping shell map to program state combinations that include a program state other than the first 4 program states (e.g., the program states L4 and L5). As shown in FIG. 8B, in this example, program state combinations of the second mapping shell include one cell having one of program states L0 to L3, and one cell carrying program state L4 or L5.

FIGS. 8A and 8B illustrate a manner in which the different 5 bit data patterns are mapped to the program state combinations corresponding to the first and second mapping shells, respectively. Diagram 860-1 illustrates mappings corresponding to the first mapping shell and diagram 860-2 illustrates mappings corresponding to the second mapping shell. In this example, the MSB (e.g., bit[4]) of the 5 bit data pattern (e.g., represented as bit[4:0]) indicates whether the data pattern maps to the first shell or the second shell. For instance, if bit[4] is "0" (e.g., the binary value of the 5 bit data pattern is less than 16), the data pattern maps to the first shell, and if bit[4] is "1" (e.g., the binary value of the 5 bit data pattern is greater than or equal to 16), the data pattern maps to the second shell.

FIG. 8A illustrates how the bits[4:0] of the 5 bit data pattern can be mapped to program state combinations of the two cells[1:0] systematically for the first mapping shell. For instance, bits [1:0] can be assigned to cell[0], and bits[3:2] can be assigned to cell[1], with the binary values of the bit pairs assigned to the cells corresponding directly to the program states of the respective cells (e.g., with the binary values "00," "01," "10," and "11," corresponding directly to L0, L1, L2, and L3, respectively).

FIG. 8B illustrates how the bits [4:0] of the 5 bit data pattern can be mapped to program state combinations of the two cells[1:0] for the second mapping shell. For program state combinations of the second mapping shell, one of cells [1:0] carries program state L4 or L5 since B is equal to 2 (e.g., 2 additional program states correspond to the second mapping shell). In this example, bit[3] is used to determine which of cells[1:0] carries program state L4 or L5 (e.g., a binary value of "0" for bit[3] indicates cell[0] carries L4 or L5, and a binary value of "1" for bit[3] indicates cell[1] carries L4 or L5. That is, bit[3] is the swap bit for this 2.5 bits/cell example. As such, as shown in FIG. 8B, if bit[3] is "0," cell[0] is the swap cell, and if bit[3] is "1," cell[1] is the swap cell. In embodiments in which B corresponds to a quantity of program states greater than one, a bit(s) can also be used to determine which of the B program states is to be carried by the swap cell. The program state carried by the swap cell is referred to herein as the "swap state." In this example, bit[2] is used to determine the swap state. For instance, if bit[2] is "0," the swap state is L4, and if bit[2] is "1," then the swap state is L5, in the example shown in FIG. 8B.

FIG. 8B also indicates the bit assignments for the cell that does not carry L4 or L5. As in the first shell mapping of FIG. 8A, in FIG. 8B, the binary value of bits[1:0] does correspond directly with program states L0 to L3 (e.g., a value of "00" corresponds to L0, a value of "01" corresponds to L1, a value of "10" corresponds to L2, and a value of "11" corresponds to L3). However, when cell[0] is the swap cell, bits[1:0] are assigned to cell[1] and when cell[1] is the swap cell, bits[1:0] are assigned to cell[0]. As such, FIGS. 8A and 8B illustrate a manner in which the different 5 bit data patterns corresponding to a first and a second mapping shell are mapped to respective program state combinations of a group of two memory cells each storing 2.5 bits/cell in accordance with a number of embodiments of the present disclosure.

As illustrated by the examples shown in FIGS. 6A through 8B, the polynomial based mappings can involve swap cells, which can result in error propagation as the programmed state of a particular cell of a group of cells storing a data pattern can effect bits stored by other cells of the group, for instance. The amount of error propagation can further increase as the number of bits/cells involved in the packing increases. However, such error propagation can be reduced and or eliminated in accordance with a number of embodiments described herein. For example, in a number of embodiments, a polynomial based mapping is used only for mapping error data (e.g., parity bits), while a different mapping (e.g., base conversion) is used for mapping the user data. As described above in association with FIGS. 4 and 5, for example, such dual mapping processes can result in an increase in the total quantity of cells used to store a particular amount of user data and its corresponding error data. However, because the error data is a relatively small portion of the codeword size, the slight increase in the total quantity of cells needed to store the data can be offset by the lack of error propagation associated with the user data. Also, since the mappings used for the user data does not involve swap cells (e.g., the mapping is systematic), LLR generation for the user data bits can be less complex as compared to multi-dimensional LLR generation that can be associated with unpacking cells mapped via a polynomial based mapping method such as those described above.

CONCLUSION

The present disclosure includes methods and apparatuses for dual mapping between program states and data patterns. One apparatus includes a memory and a controller configured to control a dual mapping method comprising: performing a base conversion on a received data pattern and mapping a resulting base converted data pattern to one of a first number of program state combinations corresponding to a first group of memory cells; and determining a number of error data units corresponding to the base converted data pattern and mapping the number of error data units to one of a second number of program state combinations corresponding to a second group of memory cells. The number of error data units are mapped to the one of the second number of program state combinations corresponding to the second group of memory cells without being base converted.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory; and
a controller configured to:
perform a base conversion process on a data pattern;
map the base converted data pattern to one of a first number of program state combinations corresponding to a first group of memory cells to which the base converted data pattern is to be stored;
generate error data based on the base converted data pattern; and
map the error data generated to one of a second number of program state combinations corresponding to a second group of memory cells to which the error data is to be stored;
wherein the first group of memory cells is configured to store a first number of data units per cell and the second group of memory cells is configured to store a second number of data units per cell, the first number of data units per cell being different than the second number of data units per cell.

2. The apparatus of claim 1, wherein the controller comprises a first mapping component configured to:
perform the base conversion process on the data pattern; and
map the base converted data patter to the one of the first number of program state combinations corresponding to the first group of memory cells.

3. The apparatus of claim 1, wherein the controller comprises a second mapping component configured to map the error data generated by the error code component to the one of the second number of program state combinations corresponding to the second group of memory cells to which the error data is to be stored.

4. The apparatus of claim 1, wherein the error data generated by the error code component comprises a number of parity bits.

5. The apparatus of claim 1, wherein at least one of the first number of data units per cell and the second number of data units per cell is a non-integer number of data units per cell.

6. The apparatus of claim 1, wherein the controller comprises an error code component configured to generate the error data based on the base converted data pattern.

7. The apparatus of claim 1, wherein:
the second group of memory cells comprises G memory cells each programmable to a respective one of L program states;
the error data is to be stored to the group of G memory cells as one of a number of N unit data patterns to which program state combinations of the G memory cells are mapped; and the apparatus is configured to program each memory cell of the group of G memory cells to a respective one of the L program states such that a combination of the program states of the group maps to the one of the number of N unit data patterns;
wherein the respective program states to which the memory cells of the group of G memory cells are programmed such that the combination of the program states of the group maps to the one of the number of N unit data patterns is determined using a mapping based, at least partially, on a polynomial expression of order equal to G, a first term of the polynomial expression corresponding to a first mapping shell and a second term of the polynomial expression corresponding to a second mapping shell.

8. The apparatus of claim 7, wherein the first mapping shell comprises constellation points corresponding only to program state combinations that do not include at least one of L program states to which the group of G memory cells are programmable, L being a minimum number of program states needed to store N/G units of data per memory cell of the group of G memory cells.

9. The apparatus of claim 7, wherein the polynomial expression is $(A+B)^G$ with $A^G$ being a quantity of constellation points of the first mapping shell and $G \times A^{(G-1)} \times B$ being a quantity of constellation points of the second mapping shell.

10. The apparatus of claim 9, wherein A is a quantity of program states from which the respective program state combinations corresponding to the first mapping shell are determined and B is a quantity of additional program states from which the respective program state combinations corresponding to the second mapping shell are determined.

11. An apparatus, comprising:
a memory; and
a controller configured to:
expand a received data pattern from a first number of data units to an expanded number of data units;
map the expanded number of data units to one of a first number of program state combinations corresponding to a first group of memory cells to which the expanded number of data units are to be stored;
generate a number of error data units based on the expanded number of data units; and
map the error data units to one of a second number of program state combinations corresponding to a second group of cells to which the number of error data units are to be stored;
wherein the first group of memory cells is configured to store a first number of data units per cell and the second group of memory cells is configured to store a second number of data units per cell, the first number of data units per cell being different than the second number of data units per cell.

12. The method of claim 11, wherein expanding the received data pattern comprises performing a base conversion on the received data pattern.

13. The method of claim 12, wherein performing the base conversion comprises constraining the mapping of the expanded number of data units to a particular base, and wherein the mapping of the error data units is not base-constrained.

14. The method of claim 11, wherein the controller is further configured to:
store the expanded number of data units and corresponding error data units in their respective groups of memory cells in accordance with the respective mappings;

determine data currently stored in the first and second groups of memory cells by performing a read operation on the first and second groups of memory cells; and perform an error decode operation on the data determined from the read operation prior to contracting the number of data units read from the respective group of memory cells from the expanded number of data units back to the first number of data units.

15. An apparatus, comprising:

a memory; and a controller configured to:
- map a base converted data pattern to one of a number of program state combinations corresponding to a first group of memory cells each configured to store a fractional number of data units per cell; and
- map a number of error data units corresponding to the base converted data pattern to one of a number of program state combinations corresponding to a second group of memory cells each configured to store a fractional number of data units per cell;
- wherein the number of error data units are mapped to the one of the number of program state combinations corresponding to the second group of memory cells based on a mapping constellation comprising at least a first mapping shell and a second mapping shell; and
- wherein the fractional number of data units per cell corresponding to the first group of memory cells is different than the fractional number of data units per cell corresponding to the second group of memory cells.

16. The apparatus of claim 15, wherein the fractional number of data units per cell corresponding to the first group of memory cells is greater than the fractional number of data units per cell corresponding to the second group of memory cells.

17. The apparatus of claim 15, wherein the controller is further configured to map the number of error data units by determining at least one swap cell for constellation points of at least one of the first mapping shell and the second mapping shell.

18. The apparatus of claim 15, wherein the controller is further configured to:
- write the base converted data pattern and the number of error data units to the first and second groups of memory cells in accordance with the respective mappings; and
- generate log likelihood ratios (LLRs) corresponding to data read from the first and second groups of memory cells prior to converting data read from the first group of memory cells from a base converted data pattern to a non-base converted data pattern.

19. The apparatus of claim 15, wherein the controller is further configured to generate the base converted data pattern by converting a number of base-2 data units to a number of base-X data units, where X is greater than two, and wherein the value of X is based, at least partially, on a quantity of program states to which the memory cells of the first group are programmable.

20. The apparatus of claim 15, wherein the second group of memory cells comprises G memory cells and the number of error data units comprises N error data units, and wherein the N error data units are mapped via a mapping based, at least partially, on a polynomial of order G, with a first term of the polynomial expression corresponding to the first mapping shell and a second term of the polynomial expression corresponding to the second mapping shell.

* * * * *